United States Patent [19]
Cunningham et al.

[11] Patent Number: 5,872,016
[45] Date of Patent: Feb. 16, 1999

[54] PROCESS OF MAKING AN OPTOELECTRONIC DEVICES UTILIZING MULTIPLE QUANTUM WELL PIN STRUCTURES

[75] Inventors: John Edward Cunningham, Lincroft; Keith Wayne Goossen, Aberdeen; William Young Jan, Scotch Plains, all of N.J.; Michael D. Williams, Stone Mountain, Ga.

[73] Assignee: Lucent Technologies Inc., Murray Hill, N.J.

[21] Appl. No.: 665,618

[22] Filed: Jun. 18, 1996

[51] Int. Cl.⁶ .................................................. H01L 21/20
[52] U.S. Cl. ........................... 437/107; 437/105; 117/85; 257/257; 257/458
[58] Field of Search ..................... 257/257, 256, 257/458, 656; 437/105, 107; 117/85

[56] References Cited

U.S. PATENT DOCUMENTS

| | | | |
|---|---|---|---|
| 5,210,428 | 5/1993 | Gossen | 257/21 |
| 5,212,395 | 5/1993 | Berger et al. | 257/458 |
| 5,256,887 | 10/1993 | Yang | 257/458 |
| 5,306,925 | 4/1994 | Abe et al. | 257/458 |
| 5,329,136 | 7/1994 | Gossen | 257/21 |
| 5,376,810 | 12/1994 | Hoenk et al. | 437/105 |
| 5,399,206 | 3/1995 | De Lyon | 437/105 |
| 5,436,756 | 7/1995 | Knox et al. | 257/458 |
| 5,463,977 | 11/1995 | Mannada et al. | 117/85 |

FOREIGN PATENT DOCUMENTS 0310353  4/1989  European Pat. Off. ............... 257/458

Primary Examiner—Charles L. Bowers, Jr.
Assistant Examiner—Ramamohan Rao Paladugu

[57] ABSTRACT

Optoelectronic devices such as photodetectors, modulators and lasers with improved optical properties are provided with an atomically smooth transition between the buried conductive layer and quantum-well-diode-containing intrinsic region of a p-i-n structure. The buried conductive layer is grown on an underlying substrate utilizing a surfactant-assisted growth technique. The dopant and dopant concentration are selected, as a function of the thickness of the conductive layer to be formed, so that a surface impurity concentration of from 0.1 to 1 monolayer of dopant atoms is provided. The presence of the impurities promotes atomic ordering at the interface between the conductive layer and the intrinsic region, and subsequently results in sharp barriers between the alternating layers comprising the quantum-well-diodes of the intrinsic layer.

6 Claims, 8 Drawing Sheets

PROCESS OF MAKING AN OPTOELECTRONIC DEVICES UTILIZING MULTIPLE QUANTUM WELL PIN STRUCTURES

BACKGROUND OF THE INVENTION

Semiconductor optical devices such as modulators, lasers, and photodetectors often incorporate a p-i-n structure. As is well known, such structures consist of p and n regions separated by a very lightly doped intrinsic region of one or more semiconductor materials. The intrinsic region may, for example, comprise a single layer of silicon (Si), gallium arsenide (GaAs), indium phosphide (InP) or aluminum gallium arsenide (AlGaAs). The intrinsic region of an optical modulator, for example, typically comprises a multiple-quantum-well (MQW) region that includes multiple well and barrier layers.

In devices of the aforementioned type, the lower or buried layer of the p-i-n structure is often epitaxially grown on the uppermost surface of a reflective mirror structure. When a bias voltage is applied to the p-i-n structure, light reflected by the mirror structure is absorbed by the quantum wells in the intrinsic region. As will be readily appreciated by those skilled in the art, the capacity of an optoelectronic device to imprint information optically is a function of this ability to alternately absorb and admit light incident thereon with changes in bias voltage.

The focus of conventional MQW device fabrication techniques has, heretofore, been limited to minimizing defects such as deep traps, recombination centers, interstitials and vacancies, and chemical impurities. While these considerations are important, there are other factors which arise during the fabrication process which may affect the optical properties of such devices. The intrinsic regions of MQW devices are engineered with atomic scale layering to optimally exploit their optical properties. It is known that surface roughness of a single monolayer height can substantially degrade the optical properties of structures utilizing atomic layering. In fact, where surface roughness exceeds several atomic layers, an MQW device may be rendered totally inoperative. It is therefore highly desirable to minimize defects and, in particular, roughness which occurs on an atomic scale.

The atomic smoothness/roughness of the buried p-i-n conductive layer will necessarily affect the surface characteristics and atomic ordering of the subsequently grown intrinsic region. Previous investigations, however, have suggested only that the intrinsic layer of the p-i-n structure should be grown on an n-type layer ("n-down") rather than on a p-type layer ("p-down"). In fact, a review of the technical literature in this field reveals few examples of a p-down p-i-n structure and, even where such structures are reported, the p-down region is employed for purposes other than atomic scale roughness (e.g., controlling the band structure of the device). Thus, heretofore, no one has sought to promote smooth atomic ordering of the MQW intrinsic region of a p-i-n structure by controlling the surface characteristics of the buried conductive layer thereof.

SUMMARY OF THE INVENTION

Optoelectronic devices such as photodetectors, modulators and lasers with improved optical properties are provided with an atomically smooth transition between the buried conductive layer and the quantum-well-diode containing intrinsic region of a p-i-n structure. The buried conductive layer is grown on an underlying substrate utilizing a surfactant-assisted growth technique. The dopant and dopant concentration are selected, as a function of the thickness of the conductive layer to be formed, so that a surface impurity concentration of from 0.1 to 1 monolayer of dopant atoms is provided. The presence of the impurities promotes atomic ordering at the interface between the conductive layer and the intrinsic region, and subsequently results in sharp interfaces between the alternating layers comprising the quantum-well-diodes of the intrinsic layer.

These and additional features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
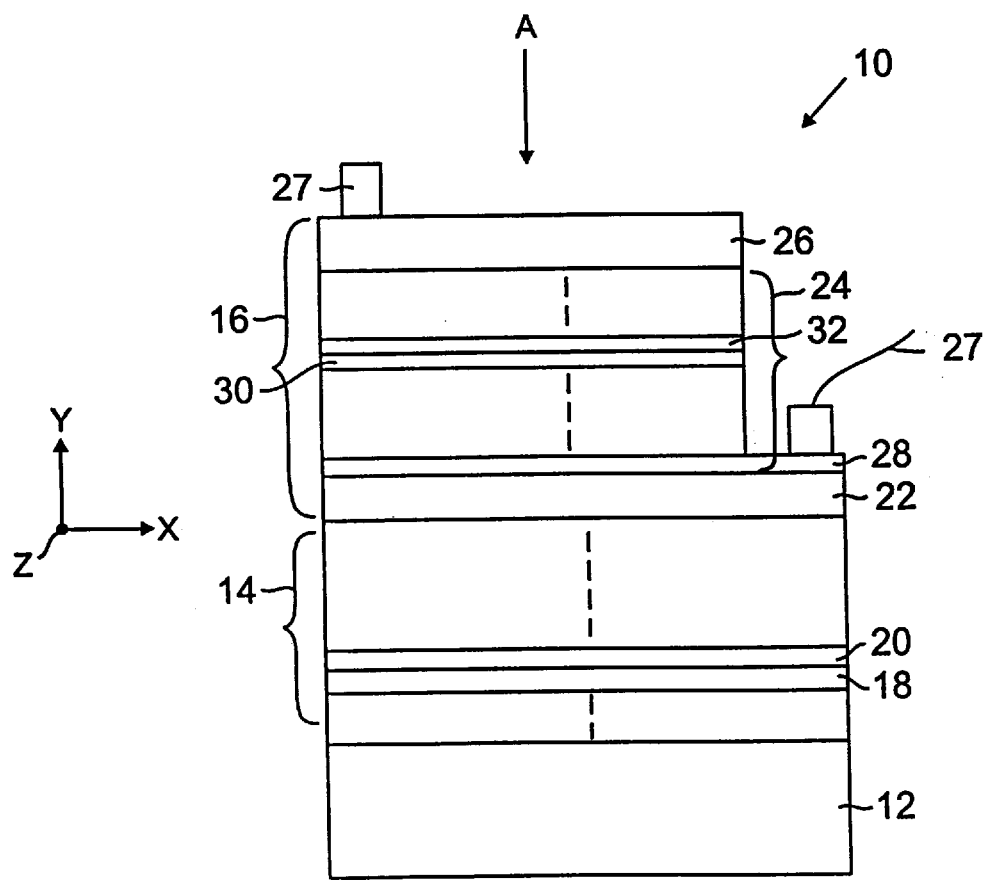
FIG. 1 is a schematic cross section of an illustrative integrated optoelectronic device constructed in accordance with the surfactant-assisted growth technique of the present invention.
Figure 2:
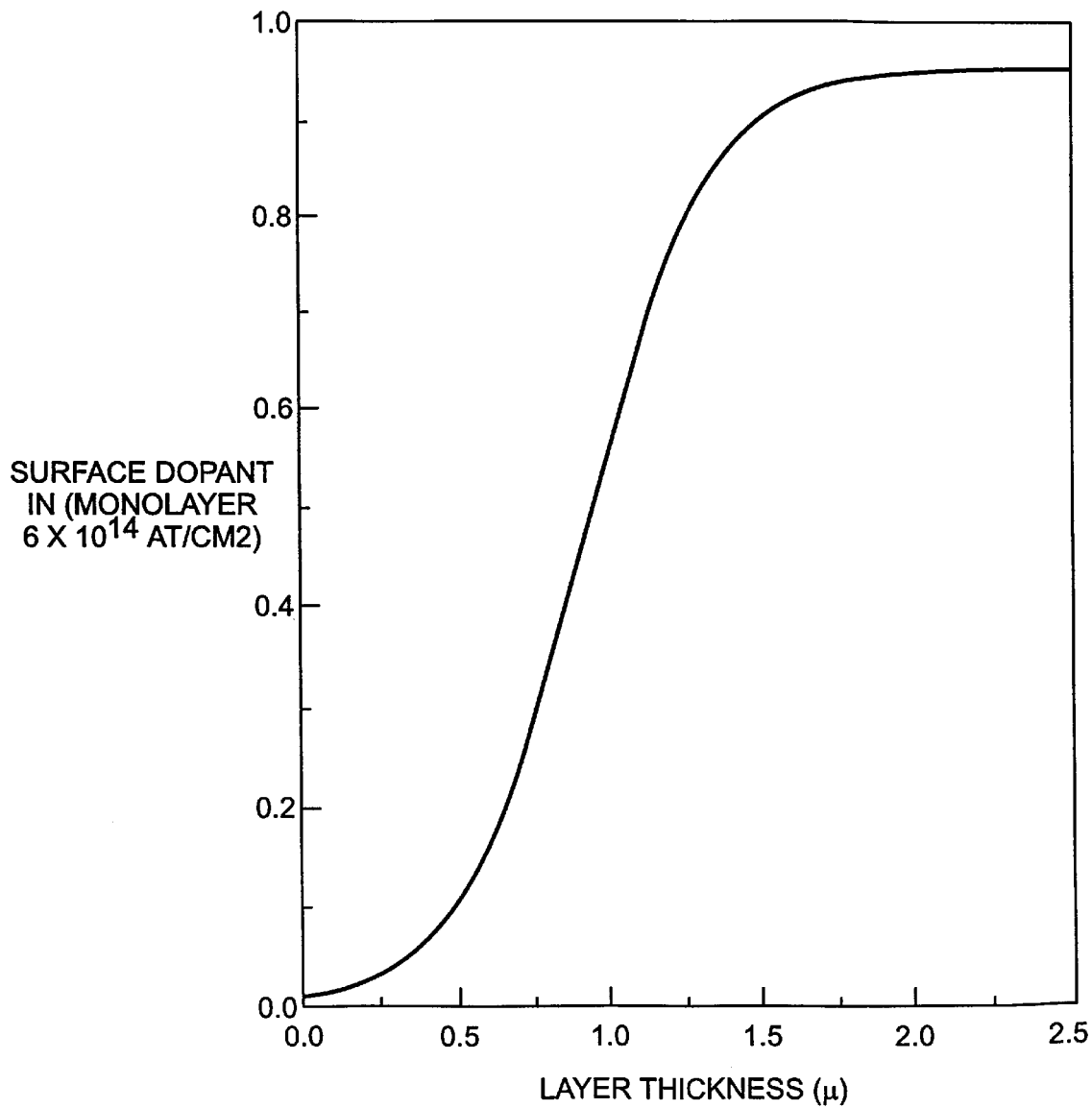
FIG. 2 is a graphical representation illustrating the relationship between surface dopant concentration and conductive layer thickness.

Initially, it should be noted that although a single modulator device constructed in accordance with an illustrative embodiment of the present invention is shown and described in detail herein, the principles of the present invention are applicable to a wide variety of optoelectronic devices utilizing p-i-n quantum-well structures. Moreover, although only a single optical device is shown to simplify the drawing and accompanying description, it is contemplated that integrated circuit assemblies comprising a plurality of such optical devices may be fabricated in accordance with the teachings set forth herein.

With reference now to FIG. 1, there is shown a MQW modulator 10 constructed in accordance with the novel processing technique of the present invention. As can be seen in FIG. 1, modulator 10 comprises a substrate 12, a dielectric mirror structure 14 formed thereon, and a p-i-n structure 16 formed on mirror structure 14. The general structure of a modulator device such as the modulator 10 is well known and the components thereof, with the exception of p-i-n structure 16, may be fabricated in accordance with conventional semiconductor processing techniques. Substrate 12, for example, may be made of a compound semiconductor material such as a Group III-V semiconductor material. Illustratively, the substrate 12 comprises undoped GaAs. Alternatively, however, the semiconductor material comprising the substrate 12 may be doped n- or p-type material.

A multi-layered mirror or reflector structure 14 is grown on the upper surface (parallel to the X-Z plane depicted in FIG. 1) of substrate 12. Illustratively, the mirror structure is grown as plural pairs of AlAs and $Al_xGa_{1-x}As$ layers topped with a relatively thicker layer of $Al_xGa_{1-x}As$. As a specific example, mirror structure 14 may comprise sixteen paired layers (only one such pair, comprising layers 18 and 20, is shown) of AlAs having a thickness of 711 Å and an index of refraction of about 2.9 and $Al_{0.11}Ga_{0.89}As$ having a thicknesses of 599 Å and an index of refraction of approximately 3.5. For a modulator device designed to operate at a particular center optical wavelength, each layer of the mirror structure shown in FIG. 1 is fabricated to have a thickness of $\lambda/4n$, where $\lambda$ is the intended center optical wavelength of the device and n is the index of refraction of the layer. Such a conventional multi-layered mirror structure is typically designed to be highly reflective to optical signals at the center wavelength. The uppermost $Al_{0.11}Ga_{0.89}As$ layer is undoped to prevent the diffusion of dopants from the lower layer of p-i-n structure 16 into the mirror layers and has a thickness of a half wavelength, e.g. 1198 Å, in order to minimize interaction with light passing through. Optical signals to be reflected by the aforementioned mirror structure are directed at the modulator device 10 approximately parallel to the indicated Y-axis; such signals are schematically represented in FIG. 1 by the arrow A.

With continued reference to the illustrative optoelectronic device depicted in FIG. 1, the fabrication of a p-i-n structure 16 in accordance with the surfactant assisted growth technique of the present invention will now be described in detail. As seen in FIG. 1, p-i-n structure 16 includes a first optically transparent, for the operable wavelengths, and electrically conductive layer 22 epitaxially grown on the upper surface of the uppermost layer of mirror structure 14, an intrinsic region 24, and a second optically transparent, for the operable wavelengths, and electrically conductive later 26. Layer 22 is comprised of a compound semiconductor material such, for example, as $Al_xGa_{1-x}As$ and is suitably doped to render it conductive. In this regard, however, it should be noted that in accordance with the surfactant-assisted growth process of the present invention, the selection of the dopant and concentration thereof is influenced not only by the conductivity type sought, but also by the need to achieve an impurity concentration of between 0.1 to 1 monolayer (ML), where 1 ML=$6\times10^{14}$ atoms/cm$^2$, on the upper surface of conductive layer 22. The magnitude of the surface impurity concentration is influenced by both the thickness of the conductive layer and the incorporation length for the dopant.

Illustratively, conductive layer 22 may be grown as a layer of p-type $Al_xGa_{1-x}As$. By way of a specific example, the conductive layer comprises a 1 micron thick layer of $Al_{0.3}Ga_{0.7}As$ doped with Be to a concentration of $1\times10^{18}$ cm$^3$, resulting in a surface concentration of 0.6 ML ($3.6\times10^{14}$ atoms/cm$^2$). As will be discussed in greater detail hereinbelow, the accumulation of impurities on the surface of conductive layer 22 promotes smooth atomic ordering between the well and barrier interfaces of the intrinsic layer. These atomically smooth transitions make it possible to realize MQW-regions having significantly higher absorption coefficients, as a function of applied bias voltage, when compared to devices fabricated in accordance with conventional processing techniques. An electrical connection is made to the conductive layer 22 by means of a conventional ohmic contact 20.

With continued reference to FIG. 1, it will be seen that electroabsorbtive intrinsic region 24 includes a buffer layer 28 of $Al_xGa_{1-x}As$ grown on the surface of conductive layer 22 to prevent diffusion of surface impurities into the intrinsic region 24. Illustratively, as indicated earlier above, and as is well known in the art, intrinsic region 24 further comprises a conventional MQW region that includes multiple alternating well and barrier layers. By way of example, the region 24 comprises 100 identical pairs of barrier layers ($Al_yGa_{1-y}As$) and well layers (GaAs). Only one such pair, comprising layers 30 and 32, respectively, is explicitly shown in FIG. 1. In the example depicted in FIG. 1, intrinsic region 24 comprises a 500 Å thick $Al_{0.3}Ga_{0.7}As$ followed by 100 pairs of 35 $Al_{0.3}Ga_{0.7}As$ and 95 Å GaAs.

Optically transparent and electrically conductive layer 26 is formed on the uppermost layer of $Al_{0.3}Ga_{0.7}As$, which uppermost layer is undoped to provide a buffer, as discussed above. In the case where buried conductive layer 22 is p-type, conductive layer 26 is doped n-type with a suitable impurity such, for example, as silicon. A suitable ohmic contact 27 is provided by metallization or other conventional technique.

Figure 3:
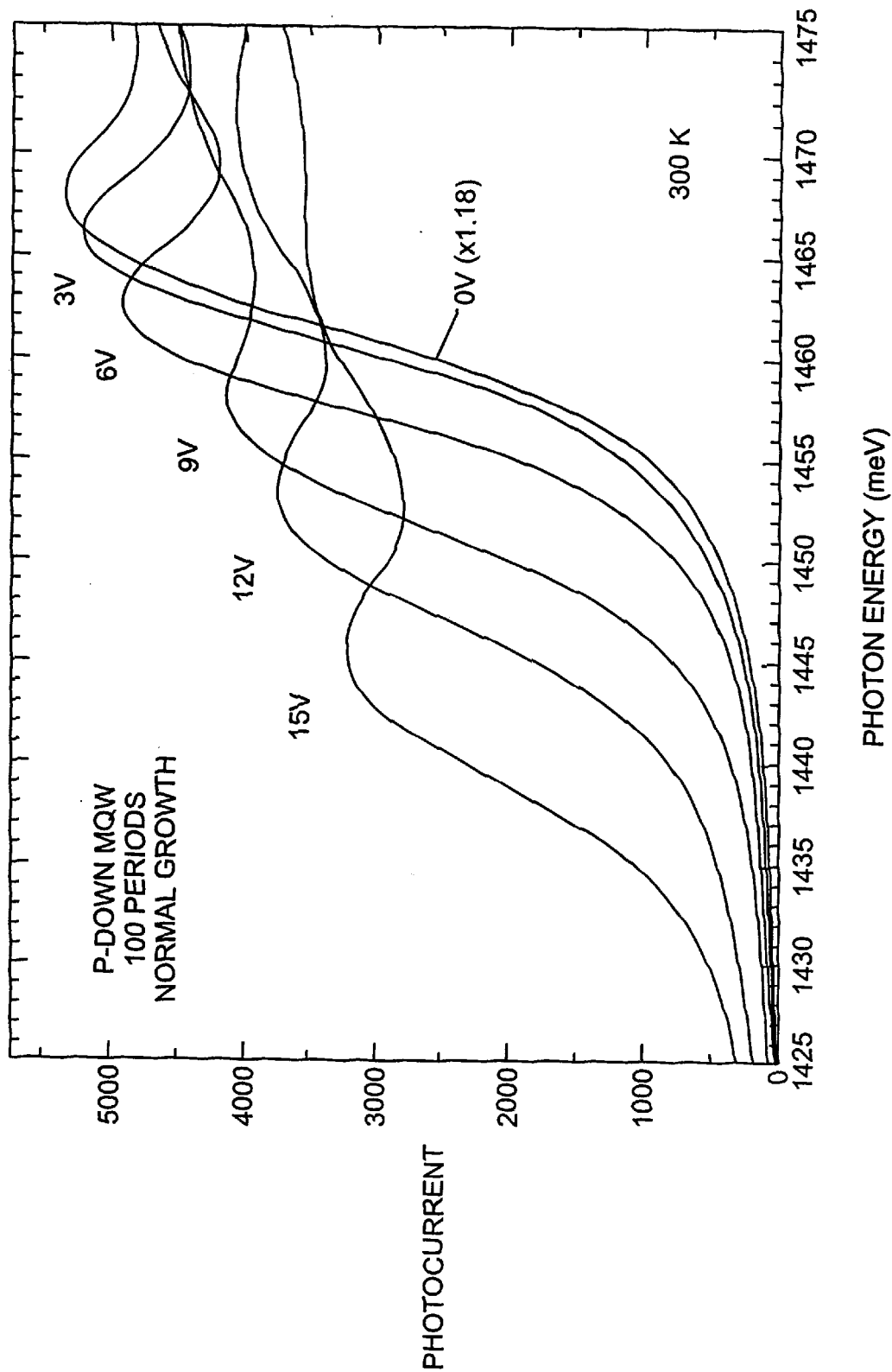
FIGS. 3 and 4 are photocurrent spectra relating photocurrent (photon absorption) as a function of incident photon energy at selected bias voltages for the optical modulator device of FIG. 1 and a conventional modulator having a buried n-type conductive layer, respectively.
Figure 4:
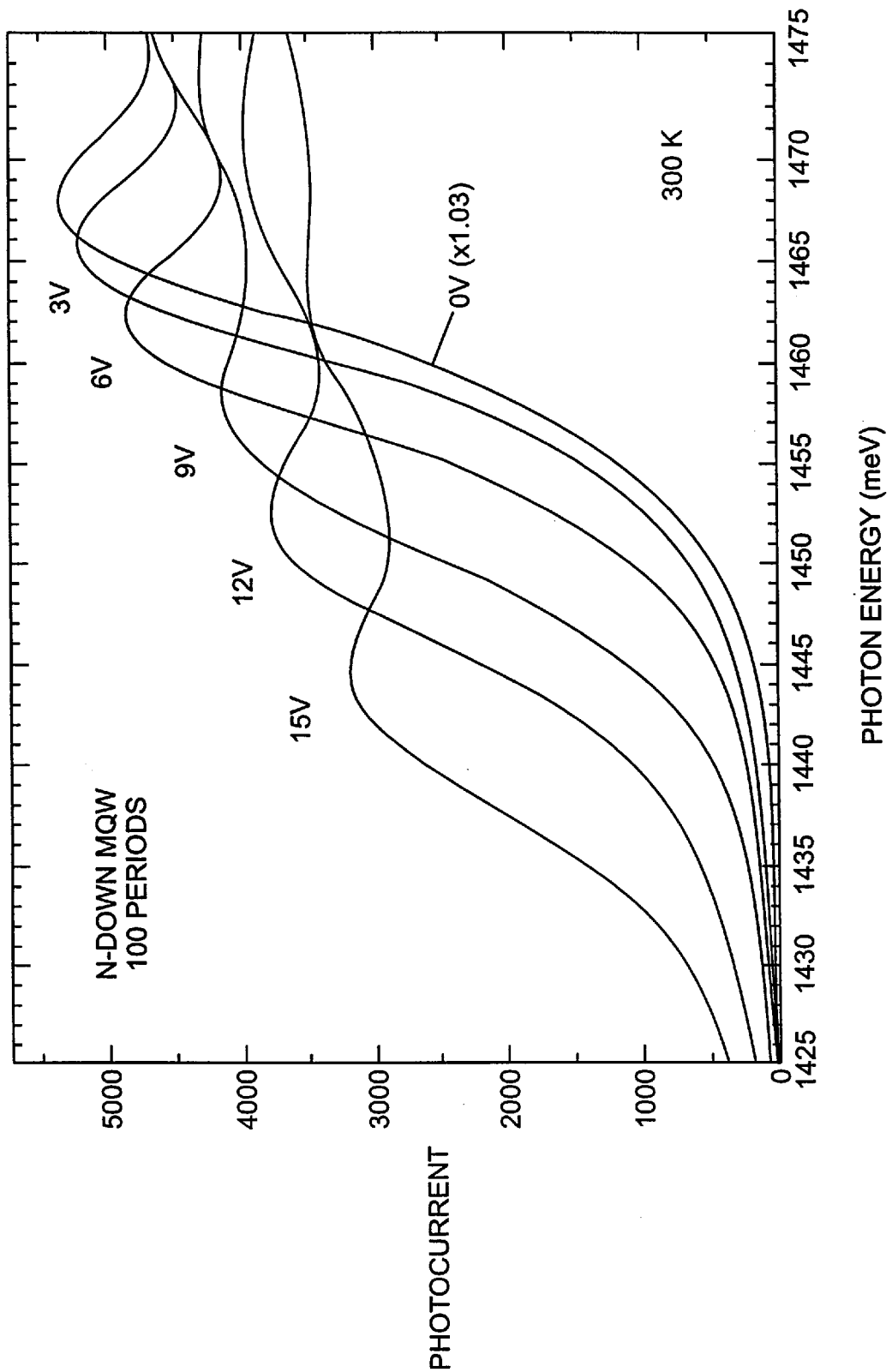
Figure 5:
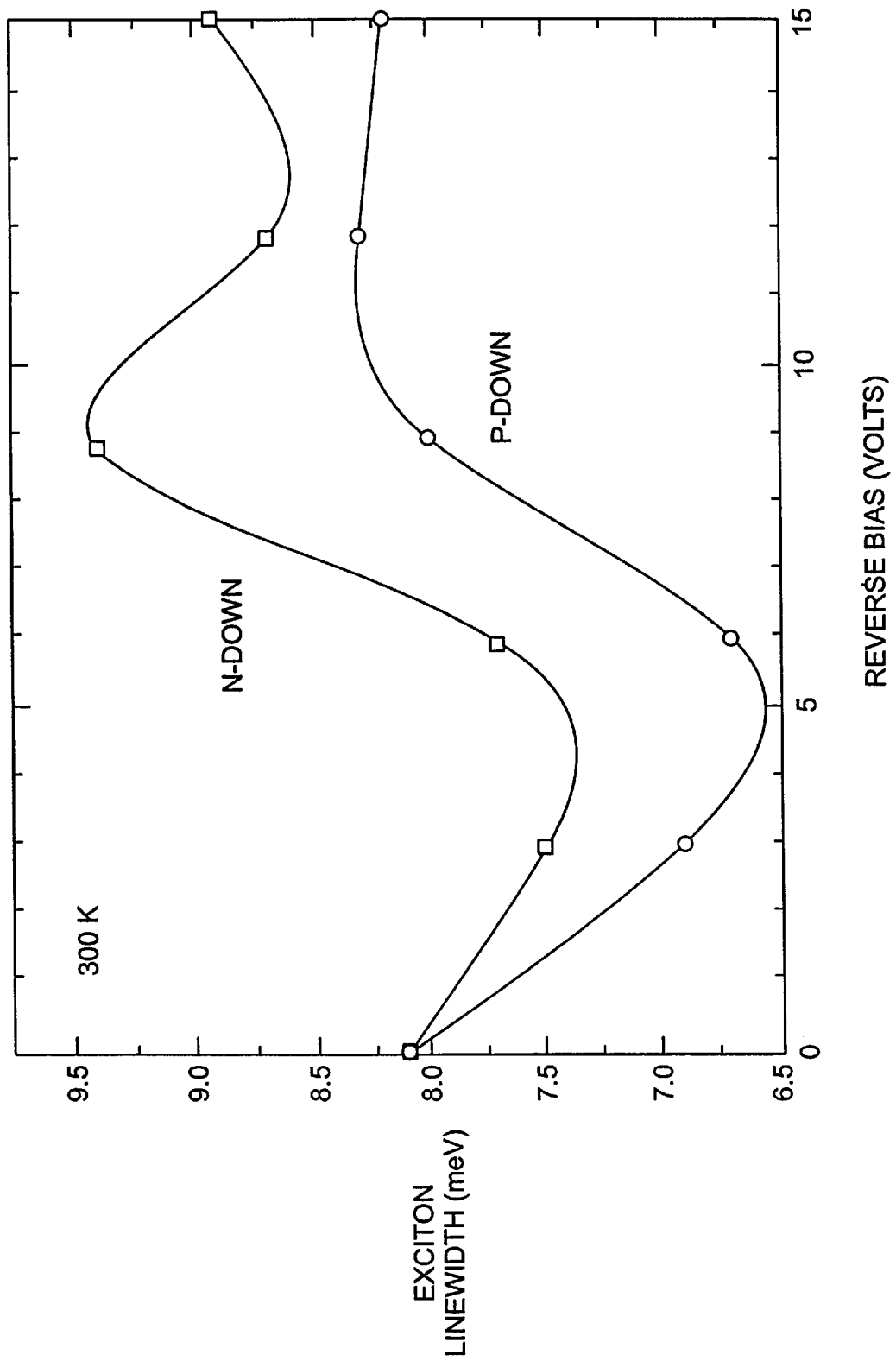
FIG. 5 is a graphical representation depicting the exciton linewidths as a function of reverse bias voltages utilizing data taken from FIGS. 3 and 4.

With reference to FIGS. 3–5, the absorption characteristics of the optical modulator device depicted in FIG. 1 (hereinafter "p-down") are compared to a modulator constructed in accordance with conventional processing techniques. For purposes of comparison, the lower p-i-n conductive layer of the conventional modulator (not shown) was doped n-type with Si to a typical concentration of $2\times10^{18}$ atoms/cm$^3$. The surface concentration of Si was 0.07 ML for the conventionally fabricated "n-down" structure, or one-tenth the concentration of Be measured for the "p-down" modulator of FIG. 1.

FIGS. 3 and 4 are graphical representations depicting the multiple quantum-well photocurrent spectra versus photon energy as a function of the bias voltage applied for the "p-down" and "n-down" modulator devices described above. As can be seen in each of FIGS. 3 and 4, photocurrent decreases as the bias voltage is increased. That is, in accordance with the Quantum Confined Stark Effect (QCSE), the coefficient of photonic absorption decreases and the linewidth broadens as bias voltage increases. As will be readily appreciated by those skilled in the art, broadening of the linewidth reflects a poorer on-off ratio and thus limits the amount of information which can be optically transmitted. Significantly, and as shown in FIG. 5, the "p-down" structure fabricated in accordance with the present invention demonstrated substantially improved absorption and linewidth characteristics over the conventional structure. For example, over the typical bias voltage range of 8–9 volts, the exciton linewidth decreased by over thirty percent.

Figure 6:
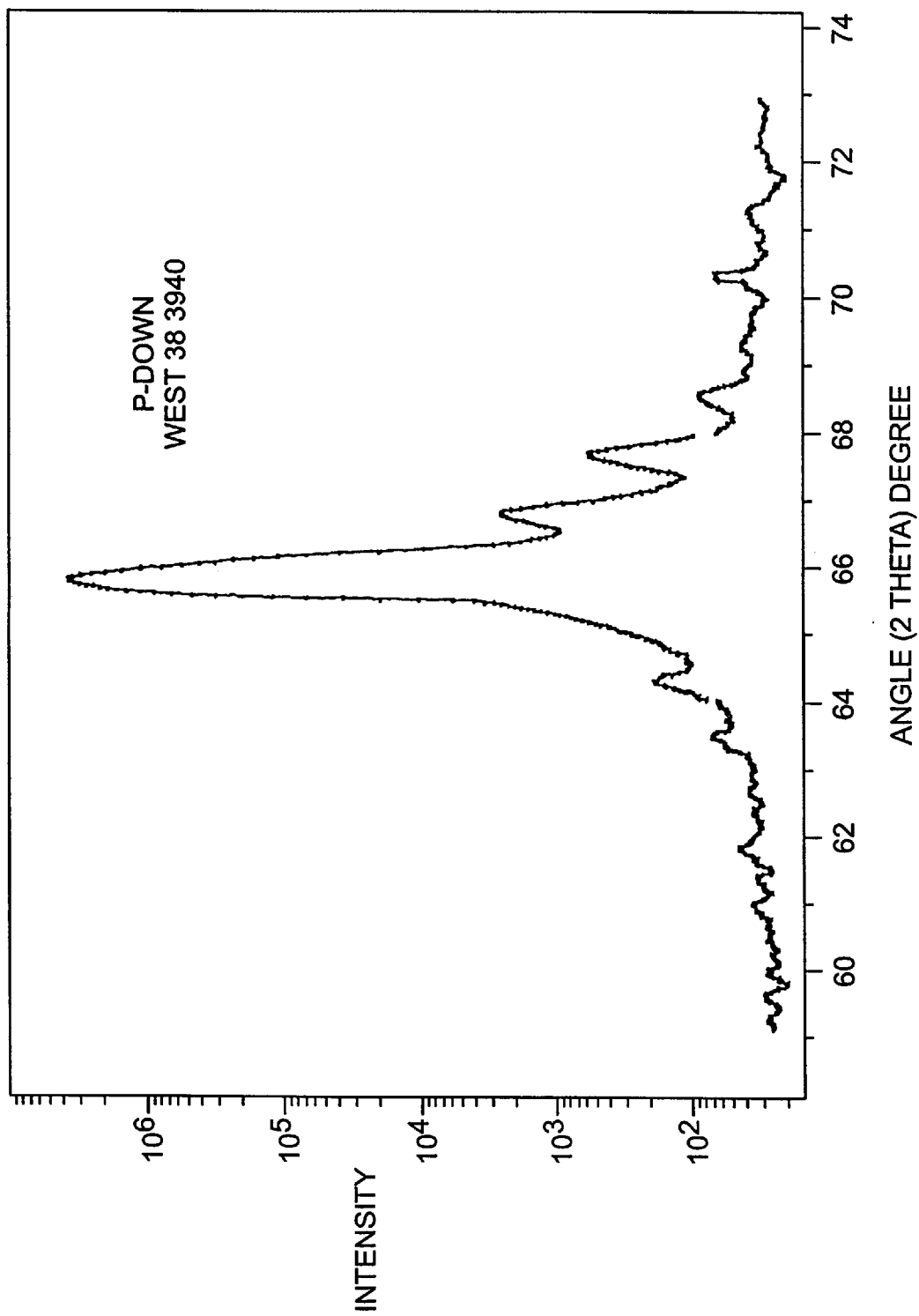
FIGS. 6 and 7 are x-ray diffraction charts depicting the distribution and intensity of higher order modes due to scattering modulation.
Figure 7:
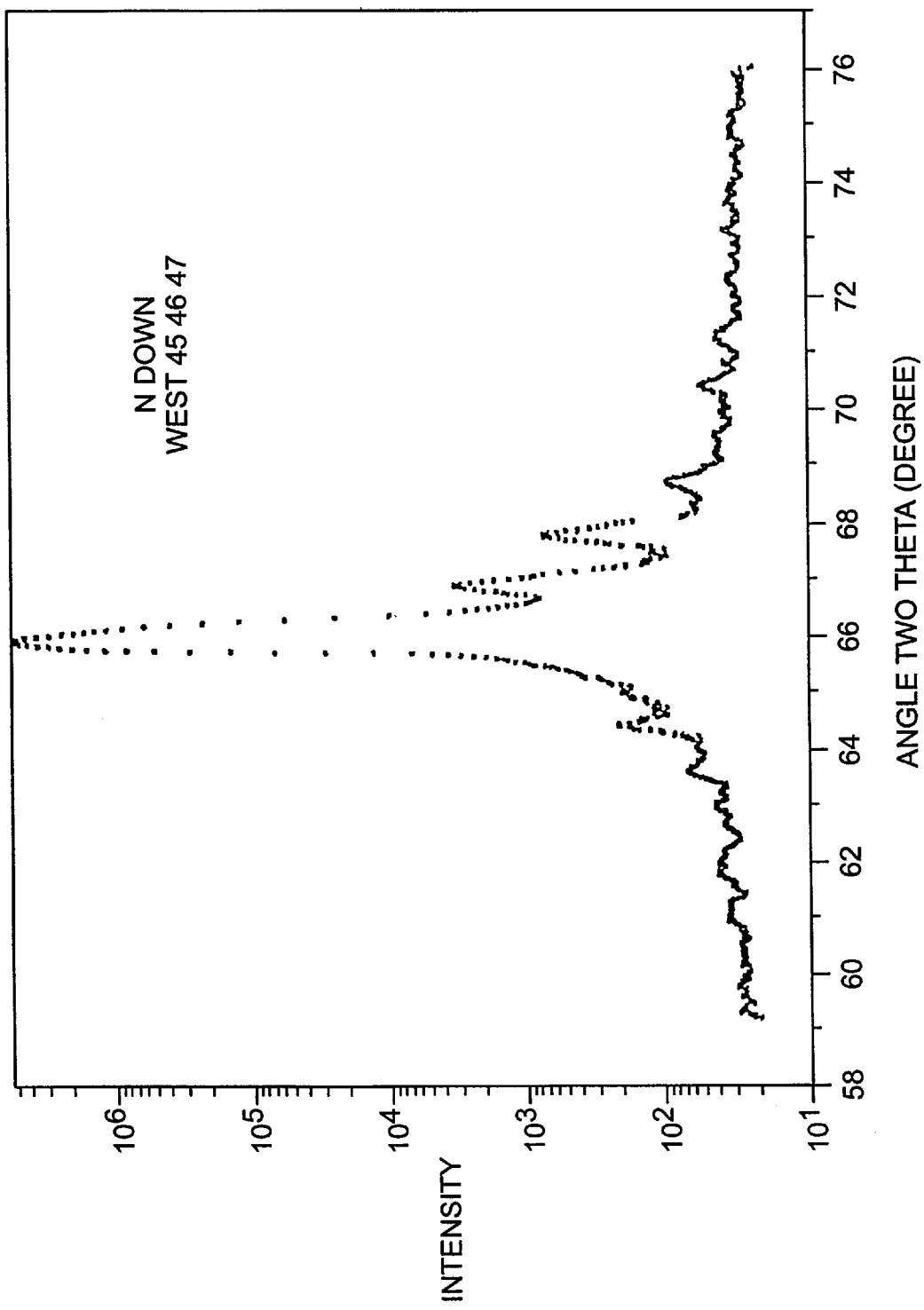
Figure 8:
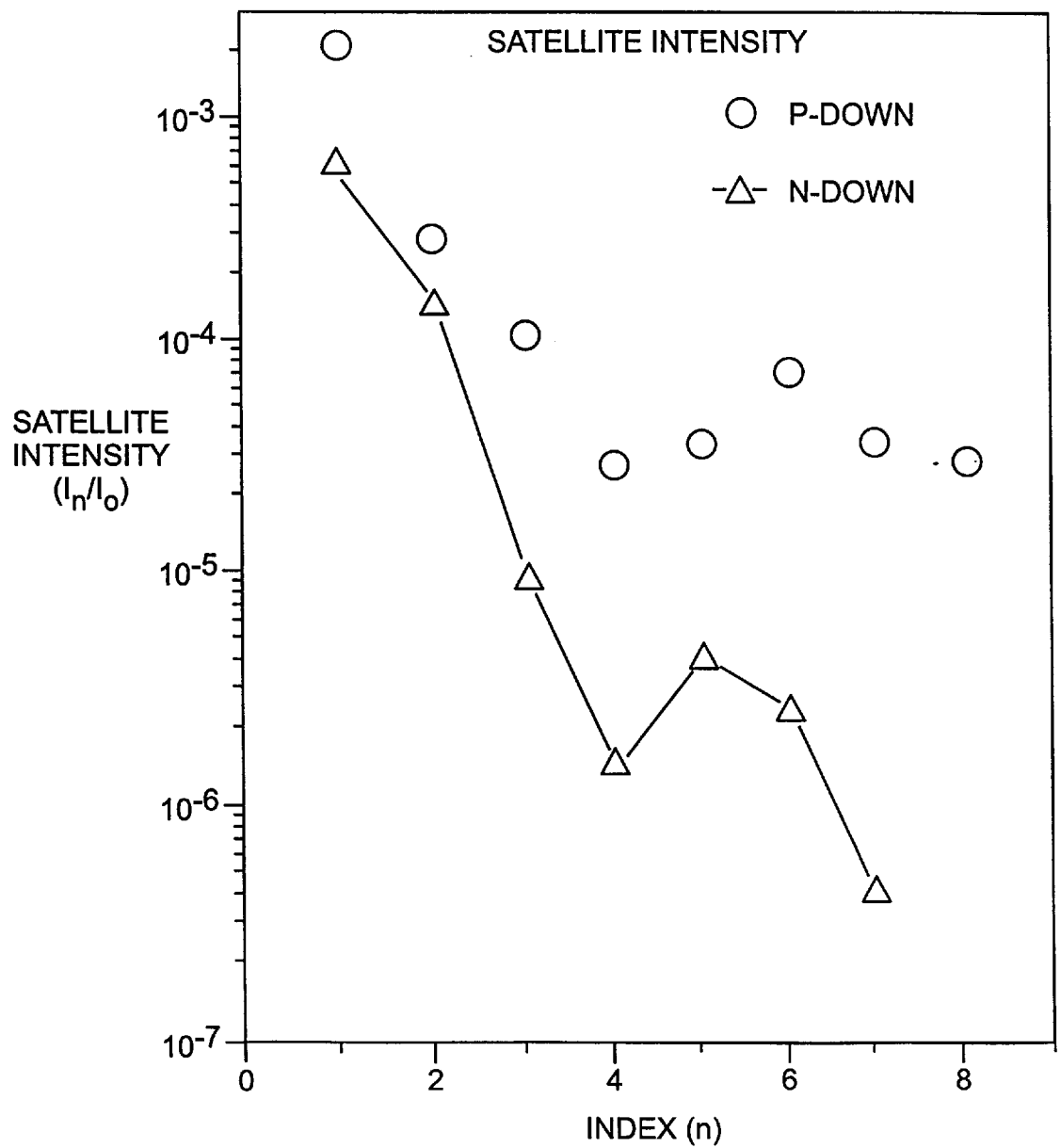
FIG. 8 is a graphical representation of intensity at the higher order modes as a function of refractive index for each of the devices of FIG. 1 and the conventional n-down structure.

FIGS. 6 and 7 are X-ray diffraction images of the "p-down" and "n-down" structures, respectively. As seen in each of FIGS. 6 and 7, the differing scattering characteristics of the GaAs and AlGaAs materials result in the propagation of quasi-symmetrical peaks, signifying higher order diffraction modes or satellites, about the main Bragg Diffraction peak. As the index of the superlattice diffraction increases, the intensity of these peaks decreases. A graphical representation of satellite intensity versus index based upon the diffraction images of FIGS. 6 and 7 is depicted in FIG. 8. As will be readily ascertained by those skilled in the art, satellite intensity is a function of the atomic smoothness (or roughness) of the interfaces between the quantum well and barrier layers of the intrinsic region. As can be seen in FIG. 8, the "p-down" structure fabricated in accordance with the surfactant-assisted growth technique of the present invention exhibited higher satellite intensities at every point, with the most striking differences occurring at indexes above 2.

As mentioned above, the novel surfactant-assisted growth technique of the present invention may be utilized to fabricate numerous other optoelectronic devices, such for example as photodetectors and lasers. Moreover, while the invention has been described in the specific context of a gallium arsenide materials system, other materials systems such as indium gallium arsenide, indium gallium arsenide phosphide and gallium antimonide may also be used. Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A process of fabricating an optoelectronic device, comprising the steps of:

providing a substrate comprised of a semiconductor material;

growing on said substrate a first electrically conductive layer doped to a first conductivity type, said first conductive layer having a surface impurity concentration of between approximately $6 \times 10^{13}$ to $6 \times 10^{14}$ atoms/cm$^2$;

growing an undoped buffer layer on said first electrically conductive layer;

growing a quantum-well intrinsic region on said undoped buffer layer; and growing on said quantum-well intrinsic region a second substantially transparent, electrically conductive layer doped to a second conductivity type.

2. The process according to claim 1, wherein said substrate is comprised of a compound semiconductor material.

3. The process according to claim 1, wherein said substrate comprises a quantum-well reflecting stack.

4. The process according to claim 1, wherein said first conductivity type is p-type.

5. The process according to claim 4, wherein said first conductive layer is doped with Be.

6. The process according to claim 1, wherein said first conductive layer has a thickness of at least 0.5 microns.

* * * * *